United States Patent [19]
Hoshi et al.

[11] 4,349,763
[45] Sep. 14, 1982

[54] TUNING FORK TYPE QUARTZ RESONATOR

[75] Inventors: Hideo Hoshi; Shiro Mitsugi; Hiroichi Teruyama; Hideo Tabata, all of Tokyo, Japan

[73] Assignee: Kabushiki Kaisha Daini Seikosha, Tokyo, Japan

[21] Appl. No.: 50,128

[22] Filed: Jun. 19, 1979

[30] Foreign Application Priority Data

Jun. 27, 1978 [JP] Japan ................................ 53-77614

[51] Int. Cl.[3] ............................................ H01L 41/08

[52] U.S. Cl. .................................... 310/370; 310/346; 310/315

[58] Field of Search ................................ 310/370, 348

[56] References Cited

U.S. PATENT DOCUMENTS

| | | | |
|---|---|---|---|
| 3,128,397 | 4/1964 | Shinada et al. | 310/370 X |
| 3,683,213 | 8/1972 | Staudte | 310/370 X |
| 3,697,789 | 10/1972 | Kato et al. | 310/370 X |
| 4,099,078 | 7/1978 | Shibata et al. | 310/370 X |
| 4,173,726 | 11/1979 | Hanji | 310/370 X |
| 4,178,527 | 12/1979 | Kawashima | 310/370 |
| 4,178,566 | 12/1979 | Kawashima | 310/370 X |

*Primary Examiner*—Mark O. Budd
*Attorney, Agent, or Firm*—Robert E. Burns; Emmanuel J. Lobato; Bruce L. Adams

[57] ABSTRACT

A quartz crystal tuning fork resonator has a pair of vibratable arms vibratable in the flexural mode in response to excitation of driving electrodes positioned at both major surfaces and both side surfaces of each vibratable arm. The vibratable arms have a width w as measured in the widthwise direction of the major surfaces, a thickness t, and are spaced apart a distance s and the vibratable arms are dimensioned so as to satisfy the relationships $s/t \geqq 1$ and $s/w \geqq 0.4$. The resonator preferably has an overall length $L \leqq 5$ mm, an overall width $W \leqq 1$ mm and a thickness $t > 50$ and is formed by etching. The driving electrodes are configured to establish an electric field component directed parallel to the major surfaces to thereby drive the vibrating arms in the flexural mode.

7 Claims, 20 Drawing Figures

F I G. 1A
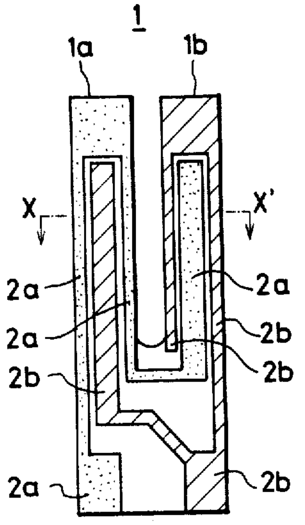
F I G. 1B
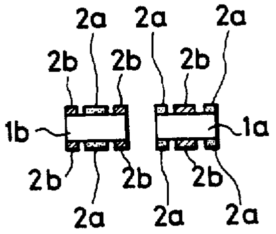
F I G. 2
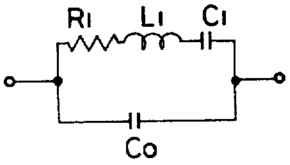
F I G. 3
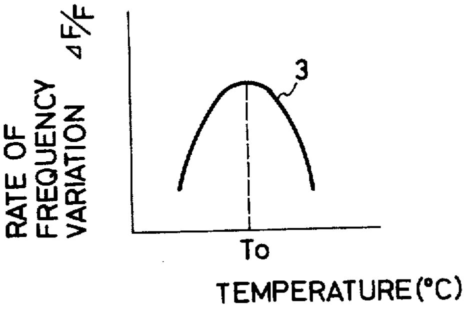

TUNING FORK TYPE QUARTZ RESONATOR

BACKGROUND OF THE INVENTION

The present invention relates to quartz resonators for electronic time pieces.

The shape and electrode construction of a conventional quartz resonator in widespread use today in electronic wristwatches is shown in FIGS. 1A and 1B.

On one resonating arm *1a* of a resonator 1 are provided an electrode *2a* at the peripheral portion and an electrode *2b* at the central portion thereof. On the other resonating arm *1b* are provided an electrode *2b* at the peripheral portion and an electrode *2b* at the central portion thereof. The peripheral electrode of the one resonating arm *1a* and the central electrode of the other resonating arm *1b* are connected together to form the electrode *2a*. In like manner the central electrode of the one resonating arm *1a* and the peripheral electrode of the other resonating arm *1b* are connected the electrode together to form the other.

As understood from the sectional view in FIG. 1B similar, electrodes are provided on the opposite major surface. Electrodes on the front and rear surfaces of the resonator 1 are connected by the means of connecting electrodes on each major surface. The shape of the resonator and the electrodes are made extremely small by the etching process.

The resonator mentioned above is in popular use and the extremely small-sized quartz resonator has a length L which is less than 6 mm and a width W thereof is less than 1 mm and has the following disadvantages with respect to yield (available percentage) and long-term reliability:

(1) If the resonator is made in an extremely small size so as to enable the small and thin, wristwatch to be made the equivalent resistance R1 of the electrical equivalent circuit of the quartz resonator shown FIG. 2 increases and thereby the current consumption increases and also the dispersion in R1 increases, and as a result the yield thereof falls.

(2) Dispersion in peak temperature To of the frequency-temperature characteristic 3 in FIG. 3 increases and the yield thereof falls.

(3) When the tuning form arms are formed by the etching process, the etching at the fork portion of the turning fork inevitably remains as shown by an oblique line portion *4a* in FIG. 4 and a non-linear phenomena and decrease in long-term reliability are brought about by local stress concentration.

A pair of quartz resonators 1 and 1 of the type shown in FIG. 1 are incorporated in an oscillating circuit and connected in parallel (refer in FIG. 16), and the frequency-temperature characteristics, particularly the zero temperature coefficient temperature To (referred to as the peak temperature hereafter) is determined by the cut angle of each of the vibrators 1, whereby flat characteristics such as shown by a curve 26 in FIG. 17 is obtained by coinciding the frequency at the peak temperature to thereby improving the frequency temperature characteristics to serve as a time-standard signal generating source. However the high peak temperature ToH on the high temperature side cannot be sufficiently high. Because when the peak temperature is changed by a change in the cut angle, the maximum peak temperature ToM exists as depicted by a curve 7 in FIG. 5. As a means to change the maximum peak temperature ToM, the thickness of the resonator can be changed. A curve 8 in FIG. 6 shows the relation between ToM and the thickness t. The curve 8 shows the case in which the frequency of the resonator is about 32 KHz, which is the most populary used frequency at present. When a pair of resonators are incorporated, it is necessary to make the resonator small in size, so the resonator taken as an example has; the whole length L: about 4 mm, the whole width W: about 0.6 mm and the spaces between the arms: less than $100\mu$. With respect to the arm space s, since the peak temperature To does not change by a change in the arm spaces s, $s \leqq 100\mu$ was selected in order to make the resonator of small size. The whole length L, the whole width W, the thickness t and the spaces between the arms of the resonator will be discribed later with reference to FIG. 10. As shown by the curve 8, the high peak temperature can be obtained if the thickness t is effectively eliminated, however, if the thickness t is made too small or eliminated, the maximum positional error $\delta$ becomes large rapidly as shown by a curve 9 in FIG. 7. The positional error $\delta$ is defined by $\delta = (fA - fB)/fA$ if the frequency in case of +z-axis in the opposite direction to the gravity is fA as shown in FIG. 8A and in case of +z'-axis in the same direction as the gravity is fB as shown in FIG. 8B. Accordingly, the positional error $\delta$ of devices which during use assume various positions such as electronic wristwatches should be made small and the thickness t cannot be eliminated. For instance, when a wristwatch exhibiting an error of 10 seconds yearly is realized, the positional error $\delta$ should be within about $4 \times 10^{-7}$ and ToM should be no more than 38° C. In order to realize a wristwatch having an error of 10 seconds yearly ToH≧40° C. is necesssary and thereby the condition that the positional error $\delta$ is within $4 \times 10^{-7}$ cannot be satisfied. Accordingly, a resonator having the small positional error $\delta$ and high peak temperature has been expected.

It is an object of the present invention to improve the characteristics of a quartz resonator for an electronic timepiece, and more particularly to decrease the equivalent resistance and dispersion in the temperature characteristics thereof. It is another object of the present invention to provide an extremely small sized quartz resonator having a positional error within $4 \times 10^{-7}$ and a high peak temperature of more than 40° C. when a plurality of quartz resonators are electrically connected in parallel to improve the frequency-temperature characteristics thereof.

BRIEF DESCRIPTION OF THE DRAWINGS

FIG. 1A and FIG. 1B are respectively a plan view and a sectional view showing the external shape and electrode construction of a tuning fork type quartz resonator in widespread use, FIG. 2 is an electrical equivalent circuit diagram of a quartz resonator, FIG. 3 is a diagram showing the frequency-temperature characteristics of a tuning fork type quartz resonator.

DETAILED DESCRIPTION OF INVENTION

Figure 4:
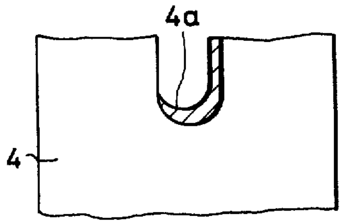
FIG. 4 is a diagram showing the condition of residual etching adjacent the fork portion of tuning the fork.
Figure 5:
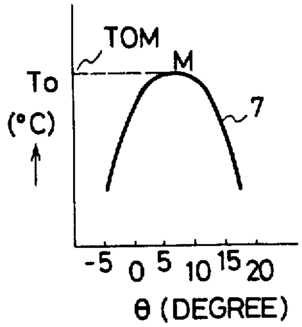
FIG. 5 is a diagram showing the relation between the peak temperature and the cutting angle.
Figure 6:
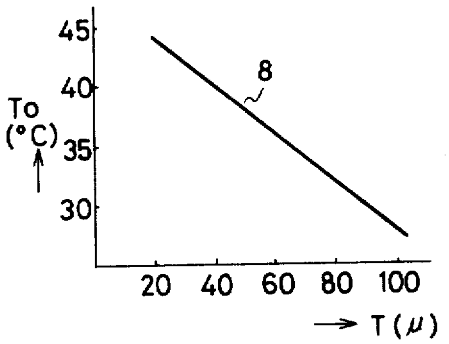
FIG. 6 is a diagram showing the relation between the maximum peak temperature and the thickness t of the conventional quartz resonator.
Figure 7:
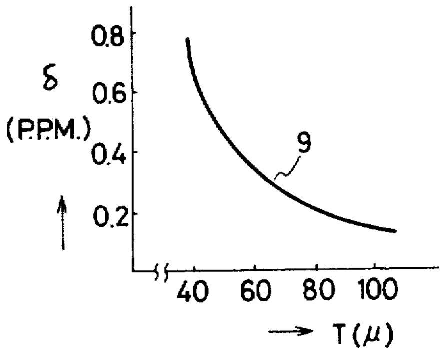
FIG. 7 is a diagram showing the relation between the positional error and the thickness t.
Figure 8A:
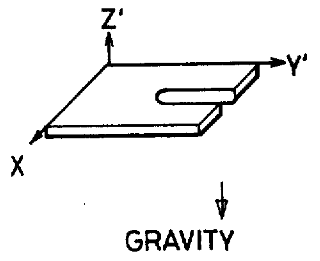
FIGS. 8A and 8B are explanatory diagrams for explaining the positional error.
Figure 8B:
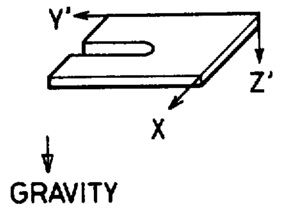
Figure 9:
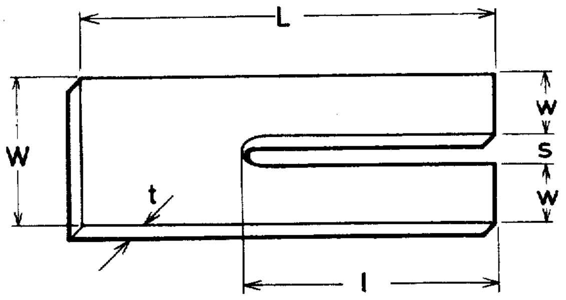
FIG. 9 is a diagram showing the external dimension of a tuning fork type quartz resonator.

FIG. 9 shows the dimensions of each of the portions of a tuning fork type resonator. The whole length, the whole width, the thickness, the width of the resonating arm, the length of the resonating arm and the space between the resonating arms of the tuning fork type resonator are respectively L, W, t, w, *l* and s.

Figure 10:
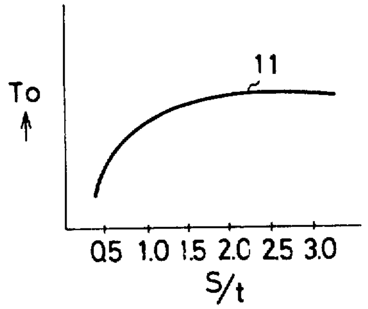
FIG. 10 is a diagram showing the relationship between the peak temperature To when the ratio s/t of the space s between the arms and the thickness t varies.
Figure 11:
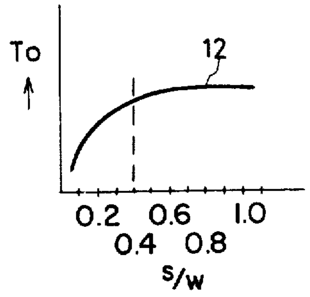
FIG. 11 is a diagram showing the relationship between the peak temperature To when the ratio s/w of the space s between the arms and the width of resonating arm w varies.

FIG. 10 shows the measured result of the peak temperature To as a function of changing the ratio s/t of the space s between arms and the thickness t of the resonator. As shown by a curve 11, the larger the space s between the arms for a resonator of constant thickness t, the more the peak temperature To saturates when s/t becomes larger. In the same way, the peak temperature To measured by changing the ratio s/w of the space s between the arms and the width w of the resonating arms, is as shown in FIG. 11.

Figure 12:
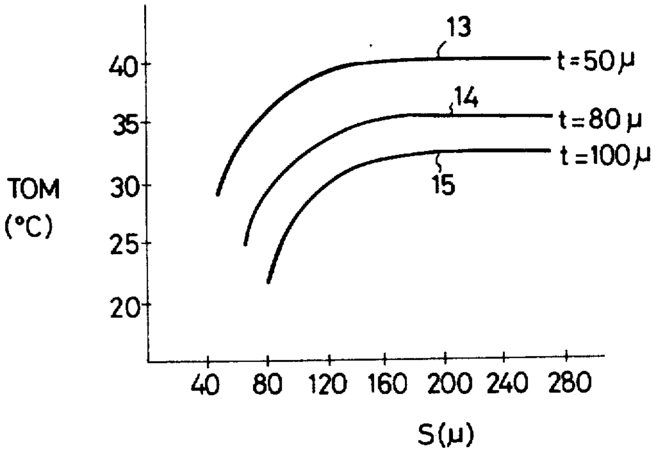
FIG. 12 is a diagram showing the relation between the maximum peak temperature ToM and the space s between the arms using the thickness t as a parameter.

As shown by a curve 12, the larger the space s between the arms with respect to the width w the resonating arms w becomes, the more the peak temperature To goes up. And when s/w becomes sufficiently large, the peak temperature To saturates. The curves 11 and 12 in FIGS. 10 and 11 illustrate the general tendencies of the peak temperature and specific curves are shown in FIG. 12. Curves in FIG. 12 show the case when the width of the resonating arm $w \approx 0.25$ mm. A curve 13 shows the peak temperature when the thickness $t=50\mu$ and a value ot ToH=40° C. can be obtained in the region in which the space s between the arms $s=160\mu$, and the initial purpose can barely be achieved. However, curves 14 and 15 show the cases where the thickness t are respectively $80\mu$ and $100\mu$. In such case the peak temperature goes up according to an increase in the space s between arms but ToM of 40° C. cannot be realized.

Figure 13A:
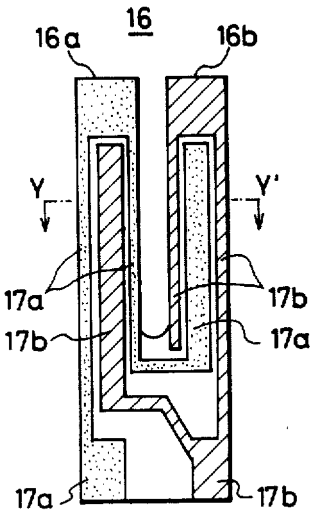
FIG. 13A and 13B show a plan view and a sectional view of the external shape and electrode construction of a tuning fork type quartz resonator provided with driving electrodes at the major surfaces and the side surfaces thereof.
Figure 13B:
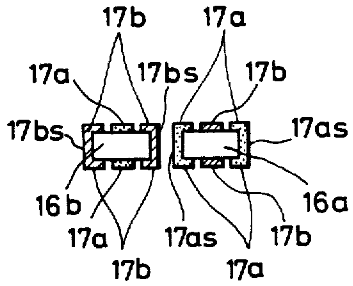
Figure 14:
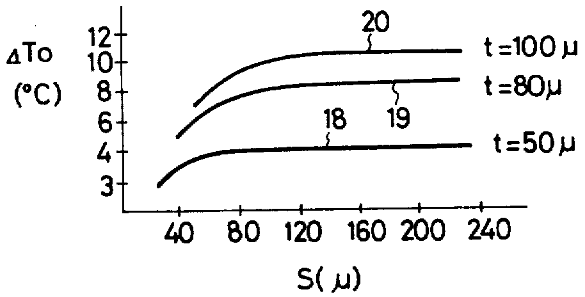
FIG. 14 is a diagram showing the relation between a peak temperature rising effect Δ To and the spaces between the arms when the side electrodes are provided using the thickness t as a parameter.
Figure 15:
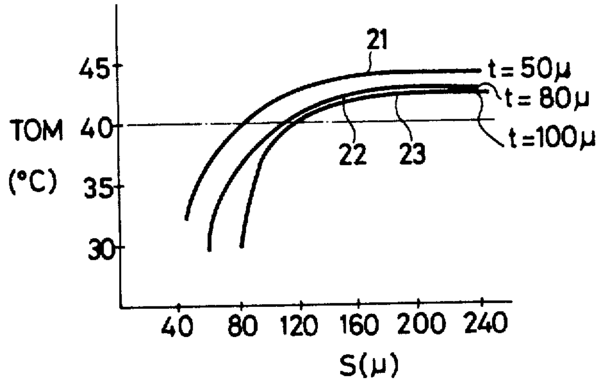
FIG. 15 is the diagram showing a relation between the maximum peak temperature ToM and the spaces between the arms when the side electrodes are provided using the thickness t as a parameter.

Referring now to FIGS. 13A and 13B showing the resonator provided with driving electrodes at the side surfaces thereof, the plan view in FIG. 13A is the same as that of FIG. 1A. As understood from FIG. 13B showing a sectional view of FIG. 13A along the time Y—Y' side, electrodes 17*as* and 17*bs* are adhered to the side surfaces of the resonator so as to electrically connect with the peripheral electrodes of the resonating arms. The side electrodes 17*as* and 17*bs* are adhered to the side surfaces of the resonator after the resonator such as shown in FIG. 1 is made by evaporation, spattering and the like using masks by which the metal film is adhered only to the side surfaces of the resonator. By utilizing the side electrodes 17*as* and 17*bs*, a decrease in the equivalent resistance by a rise in a driving efficiency and also a rise in a peak temperature can be achieved. Curves 18, 19 and 20 in FIG. 14 show peak temperatures as mentioned above. In FIG. 14, Δ To is a balance of the peak temperature Tol before the side electrodes are adhered and the peak temperature To2 after the side electrodes are adhered, and is represented by ΔTo=-To2−Tol. A curve 18 shows the case wherein the thickness $t=50\mu$, and it can be seen that the peak temperature goes up about 4° C. when the space s between arms is more than $50\mu$ and the rise in the peak temperature becomes small when the space s between arms is less than $50\mu$. A curve 19 shows the case wherein the thickness $t=80\mu$. In the region where the space s is more than $80\mu$, the peak temperature can go up about 8° C. A curve 20 shows the case wherein the thickness $t=100\mu$ and when the space is s = more than $100\mu$, the peak temperature can go up about 10° C. Accordingly, the ToM-s characteristics (the thickness t parameter) after the side electrodes are adhered to the resonator are as shown by curves 21, 22 and 23 in FIG. 15. The curve 21 shows the case wherein the thickness t is $50\mu$ and when the space s between the arms is $80\mu$, ToM≧40° C. can be obtained. In the same way, the curves 22 and 23 show the case wherein the thickness t is $80\mu$ and $100\mu$ and ToH≧40° C. can be obtained when the space s between the arms s more than $100\mu$ and = more than $120\mu$ respectively.

The condition necessary to obtain the resonator having the positional error $\delta=4\times10^{-7}$ and ToM=40° C. will now be taken into consideration. The positional error δ is induced by flexure of the resonator caused by gravity, and on method is known to eliminate the positional error except for eliminating the thickness t since it is a fundamental problem. Accordingly, $t \geqq 50\mu$ is an indispensable condition. Subsequently, in order to obtain ToH≧40° C. with the vibrator of $t > 50\mu$, the spaces between the arms should be at least about $100\mu$. The maximum thickness of the resonator which can be mass produced by the etching process is said to be around $200\mu$. In order to obtain ToM≧40° C. when the thickness t is around $200\mu$, the spaces between the arms should be more than $200\mu$ though not shown in FIG. 15. Accordingly, as for the resonator having the practicable thickness, the primary object of the present invention, namely a decrease in the positional error and a rise in the peak temperature can be simultaneously achieved by satisfying the condition $t>50\mu$, the spaces between the arms $s>100\mu$ and $s/t \geqq 1$. Since a pair of resonators are incorporated in a wristwatch, each of the resonators most be small-sized, and the whole length L = 5 mm and the whole width W = 1 mm would be the maximum size of the resonator. With respect to the resonator smaller than the above mentioned dimensions, all of the descriptions mentioned so far can be applied. Accordingly, the width of the resonating arm w is 0.4 mm at maximum. In other words, in consideration that the space s between the arms should be more than 100μ, both $s/w>0.25$ and $s/t\geqq 1$ should be satisfied. Moreover, in order to obtain more highly precise timepiece of less than 5 seconds yearly a decrease in the positional error and a rise in ToM should be simultaneously achieved. And taking the mass-productivity in case of forming the resonator by the etching process into consideration, the thickness t 70 to 150μ, the space should be within the ranges between the arms more than 120μ and $s/t>1.5$ should be satisfied.

Figure 16:
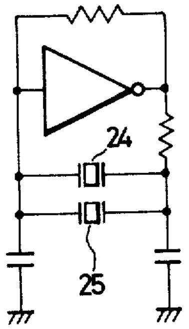
FIG. 16 is an oscillating circuit diagram according to the present invention using at least one quartz resonator according to the present invention.
Figure 17:
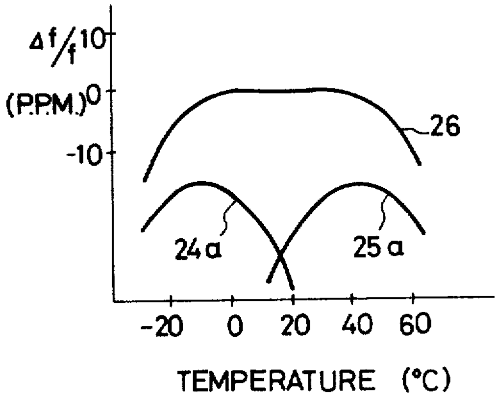
FIG. 17 is a diagram showing the frequency-temperature characteristics of the oscillating circuit in FIG. 16.

FIGS. 16 and 17 show an oscillating circuit and a diagram showing the frequency-temperature characteristic thereof using the quartz resonator heretofor described for the quartz resonator having the high peak temperature ToH. A resonator 24 is a quartz resonator having the low peak temperature ToL and a resonator 25 is a quartz resonator having the high peak temperature ToH. The frequency-temperature characteristic of each of the resonators 24 and 25 are as shown by curves 24*a* and 25*a* in FIG. 17. Here the example that ToM=42° C. and ToL=10° C. will be shown using the resonator whose whole length L≈4 mm and whose whole width W≈0.7 mm. As described in the previous paragraph, in order to mass produce such resonators by etching, the space s between the arms must be ≧120μ and the ration $s/t>1.5$ must be satisfied. Thus resonators having a whole width W=0.7 mm and having the minimum arm spacing s=120μ will have two resonating arms each of a maximum width w=0.29 mm, i.e., w≦0.29 mm. Such resonators, therefore, have a s/w ratio ≧0.41. The oscillating circuit in FIG. 16 containing parallel connected resonators 24 and 25 exhibits a very flat frequency-temperature characteristics as shown by the curve 26 which can be obtained by adjusting the circuit under the optimum condition. For instance, the frequency variation between 0° C. and 40° C. is within 2 PPM, which is an extremely superior temperature characteristics.

By adopting the resonator according to the present invention, the positional error $\delta 4\times 10^{-7}$ and the high peak temperature ToH≧40° C. are simultaneously satisfied by an extremely small-sized resonator the whole length L being less than 5 mm and the whole width W being less than 1 mm. Further as for the oscillating circuit using at least one resonator according to the present invention, a flat frequency-temperature characteristic can be easily obtained between the range of 4° C. to 36° C. Moreover a highly precise electronic timepiece such as a wristwatch, which was the primary object of the present invention, can be realized.

It is to be understood that the shape and dimension of the resonator having the low peak temperature ToL is not necessarily the same as the shape and dimension as defined in the present invention.

We claim:

1. A tuning fork type quartz crystal resonator formed by etching and having vibratable arms, a whole length L≦5 mm, a whole width W≦1 mm and a thickness t>50μ and being vibratable in the flexural mode by driving electrodes arranged at both major surfaces and side surfaces thereof; the improvement wherein the vibratable arms are dimensioned to satisfy the relationships $s/t\leqq 1$ and $s/w\geqq 0.4$ where w is the width of the vibrating arms and s is the space between the vibrating arms.

2. A tuning fork type quartz crystal resonator according to claim 1; wherein said driving electrodes are configured to establish an electric field component directed parallel to the major surfaces to thereby drive the vibrating arms in the flexural mode.

3. A tuning fork type quartz crystal resonator according to claim 1 or 2; wherein the space s between the vibrating arms is greater than 100μ.

4. In a quartz crystal tuning fork resonator having a pair of vibratable arms vibratable in the flexural mode in response to excitation of driving electrodes positioned at both major surfaces and both side surfaces of each vibratable arm, the vibratable arms having a width w as measured in the widthwise direction of the major surfaces, a thickness t, and being spaced apart a distance s: the improvement wherein said vibratable arms are dimensioned so as to satisfy the relationships $s/t\geqq 1$ and $s/w\geqq 0.4$ and wherein said resonator has an overall length L≦5 mm, an overall width W≦1 mm and a thickness t>50μ.

5. A quartz crystal tuning fork resonator according to claim 4; wherein said resonator is formed by etching.

6. A quartz crystal tuning fork resonator according to claim 4 or 5; wherein the distance s between the vibratable arms is greater than 100μ.

7. A quartz crystal tuning fork resonator according to claim 4 or 5; wherein said driving electrodes are configured to establish an electric field component directed parallel to the major surfaces to thereby drive the vibrating arms in the flexural mode.

* * * * *